US00RE45043E

(19) United States
(12) Reissued Patent
Chung

(10) Patent Number: US RE45,043 E
(45) Date of Reissued Patent: Jul. 22, 2014

(54) METHOD AND DEVICE FOR DECODING LOW-DENSITY PARITY CHECK CODE AND OPTICAL INFORMATION REPRODUCING APPARATUS USING THE SAME

(76) Inventor: Bi-Woong Chung, Seoul (KR)

(21) Appl. No.: 13/458,412

(22) Filed: Apr. 27, 2012
(Under 37 CFR 1.47)

Related U.S. Patent Documents

Reissue of:
(64) Patent No.: 7,707,482
Issued: Apr. 27, 2010
Appl. No.: 11/486,449
Filed: Jul. 13, 2006

(30) Foreign Application Priority Data

Jun. 7, 2006 (KR) ..... 10-2006-0051121

(51) Int. Cl.
*H03M 13/00* (2006.01)
*H03M 13/11* (2006.01)

(52) U.S. Cl.
CPC ..... *H03M 13/1162* (2013.01); *H03M 13/1102* (2013.01); *H03M 13/1151* (2013.01); *H03M 13/1154* (2013.01); *H03M 13/1177* (2013.01)
USPC ..... 714/752; 714/758; 714/780

(58) Field of Classification Search
CPC ..... H03M 13/1102; H03M 13/1151; H03M 13/1154; H03M 13/1157; H03M 13/1162; H03M 13/1165; H03M 13/1171; H03M 13/1177
USPC ..... 714/752, 758
See application file for complete search history.

(56) References Cited

U.S. PATENT DOCUMENTS

| | | | | |
|---|---|---|---|---|
| 7,000,167 | B2 * | 2/2006 | Coker et al. | 714/752 |
| 7,231,577 | B2 * | 6/2007 | Richardson et al. | 714/758 |
| 7,237,181 | B2 * | 6/2007 | Richardson | 714/780 |
| 7,296,216 | B2 * | 11/2007 | Shen et al. | 714/801 |
| 7,395,495 | B2 * | 7/2008 | Jacobsen | 714/804 |
| 7,441,178 | B2 * | 10/2008 | Xin | 714/800 |
| 7,502,982 | B2 * | 3/2009 | Silvus et al. | 714/753 |
| 7,516,389 | B2 * | 4/2009 | Song | 714/755 |

(Continued)

FOREIGN PATENT DOCUMENTS

EP 06 01 4930 9/2006

OTHER PUBLICATIONS

Yeo et al., "High Throughput Low-Density Parity-Check Decoder Architectures," GLOBECOM'01, 2001 IEEE Global Telecommunications Conference, San Antonio, TX. Nov. 25-29, 2001, IEEE Global Telecommunications Conference, New York, NY; IEEE, U.S. vol. 5 of 6, Nov. 25, 2001, pp. 3019-3024, XP010747547; ISBN: 0-7803-7206-9.

(Continued)

*Primary Examiner* — Sam Rizk
(74) *Attorney, Agent, or Firm* — Venable LLP; Robert S. Babayi

(57) ABSTRACT

A method of decoding a received signal encoded with an LDPC code is provided. The method comprises initializing bits with an initial value of the received signal, obtaining posterior values of the bits by iteratively decoding the bits in a row direction and a column direction, determining on the basis of the posterior values whether an iterative decoding operation should be performed and comparing the posterior values with predetermined values and updating the initial value of the bits, when it is determined that the iterative decoding operation is be performed.

20 Claims, 5 Drawing Sheets

(56) References Cited

U.S. PATENT DOCUMENTS

| | | | | |
|---|---|---|---|---|
| 7,519,898 | B2 * | 4/2009 | Narayanan et al. | 714/801 |
| 7,536,628 | B2 * | 5/2009 | Kan et al. | |
| 7,559,008 | B1 * | 7/2009 | Patapoutian | 714/800 |
| 7,561,640 | B2 * | 7/2009 | Kaynak et al. | 375/340 |
| 2005/0018263 | A1 * | 1/2005 | Pharris | 359/22 |
| 2005/0118263 | A1 * | 6/2005 | Walker et al. | |
| 2005/0240865 | A1 * | 10/2005 | Atkins et al. | 715/517 |
| 2011/0055655 | A1 * | 3/2011 | Hocevar | 714/752 |

OTHER PUBLICATIONS

Hayashi et al., "Low-Density Parity-Check Coding for Holographic Data Storage," Japanese Journal of Applied Physics, (online) vol. 44, No. 5b, May 24, 2005, XP002398394 [retrived on Sep. 11, 2006].

Burr, Geoffrey, "Holographic data storage with arbitrarily mis-aligned data pages, "Optics Letters, (online) vol. 27, No. 7, Apr. 1, 2002, XP002398395 [retrived on Sep. 11, 2006].

European Search Report issued in European Patent Application No. 06 01 4930 dated Sep. 11, 2006.

* cited by examiner

METHOD AND DEVICE FOR DECODING LOW-DENSITY PARITY CHECK CODE AND OPTICAL INFORMATION REPRODUCING APPARATUS USING THE SAME

Matter enclosed in heavy brackets [ ] appears in the original patent but forms no part of this reissue specification; matter printed in italics indicates the additions made by reissue.

BACKGROUND

1. Technical Field

The present invention relates to a method and a device for decoding a low-density parity check code and an optical information reproducing apparatus using the device.

2. Related Art

Examples of an optical information processing apparatus can include a compact disc (CD), a digital versatile disc (DVD), a high definition DVD (HD-DVD), a blue-ray(BD), and a near-field optical information processing apparatus. With recent increase in requirement for a next-generation storage system having a large storage capacity, volume holography has attracted attentions.

Volume holography has been developed for achieving high density optical recording and high data transmission rate. The volume holography is a method in which the interference patterns are written tree-dimensionally by actively utilizing the thickness direction of the recoding medium. Since the volume holography can employ a parallel signal processing operation for input and output of data, it is possible to basically enhance a data transmission rate in comparison with the CD and the DVD. In addition, it is possible to drastically enhance the recording density by using a multiplexing technique.

In recording information onto a recording medium using holography, an information beam carrying image information and a reference beam overlap each other in the recording medium and an interference pattern generated thereby is written onto the recording medium. For reproducing the recorded information, the reference beam is irradiated onto the recording medium so as to reproduce image information by diffraction in the interference pattern.

An image of a data page reproduced from the reproducing beam is detected by a light receiving array device such as a complementary metal-oxide semiconductor (CMOS) device or a charge-coupled device (CCD). The detected image of a data page is restored to original data through a series of signal processing and decoding processes.

When detecting the image of a data page, errors can often occur due to variations in characteristics resulting from contraction or rotation of the recording medium. For example, image pixels of a data page (hereinafter, referred to as "data pixels") and pixels of the light receiving array device (hereinafter, referred to as "detection pixels") may not be matched with each other due to misalignment therebetween. This error may increase a bit error rate (BER).

A variety of error correcting codes such as a Reed-Solomon code has been proposed so as to lower the BER. In recent years, a low-density parity check (LDPC) code having a performance almost equal to Shannon's channel capacity limit had attracted attentions.

The LDPC code is a linear block code in which most elements of a parity check matrix is zero. In a general parity check code, a block of information symbols and parity check symbols which are modulo sum of specific information symbols forms a code word. A relation between the check symbols and the information symbols can be expressed by a parity check matrix H. The parity check matrix H can be expressed as a set of linear homogeneous equations. The LDPC code is a kind of a parity check code and is a code having the parity check matrix H having most elements of 0 and a small number of randomly distributed weights.

A process of encoding an LDPC code having the parity check matrix H is as follows. A generator matrix G corresponding to the matrix H is obtained using a relation $GH^T=0$. The code word C corresponding to an information symbol block X is obtained by C=XG. Decoding an LDPC code is to find out a code word, the product of which by the parity check matrix H is closest to "0" in probability, from a received signal symbol. A sum-product algorithm among the methods of decoding an LDPC code is a soft-decision iterative decoding operation using probability. The sum-product algorithm is to iteratively decode an LDPC code so as to converge to a code word satisfying the maximum likelihood condition while giving and taking a message of probability in a graph of the code between nodes.

A log-likelihood ratio belief propagation (LLR-BP) using an LLR is known as another method of decoding an LDPC code. Hereinafter, the LLR-BP algorithm will be described.

Assuming that a code word is denoted by c, a transmitted signal is denoted by x, a received signal is denoted by y, and a noise of a channel is denoted by n, $y-[y_n]-x+n$ is obtained. The code word $c=(c_1, c_2, \ldots, c_N)$ is mapped to the transmitted signal $x=(x_1, x_2, \ldots, x_N)$. The decoding process is a process of obtaining a signal in which the probability of the code word with respect to the received signal is the maximum. The decoding process is a process of obtaining a code word $\hat{c}$ in which the value of $P(\hat{c}|y)$ is the maximum.

The size of the parity check matrix H is M×N and can be expressed as H=[h(m,n)]. A set of bit nodes participating in the m-th check node is expressed by $N(m)=\{n|h(m,n)=1\}$. Similarly, a set of check nodes participating in the n-th bit node is expressed by $M(n)=\{m|h(m,n)=1\}$. The magnitudes of the sets N(m) and M(n) are expressed by |N(m)| and |M(n)|. N(m)\n denotes N(m) from which the n-th bit node is excluded, and M(n)\m denotes M(n) from which the m-th check node is excluded.

Notations used for the iterative decoding algorithm are as follows.

$F_n$ denotes an LLR of the n-th bit node obtained from the received signal $y_n$.

$Z_{mn}$ denotes an LLR of the n-th bit node from the n-th bit node toward the m-th check node.

$z_n$ denotes a posterior LLR of the n-th bit node obtained from each iteration.

$L_{mn}$ denotes an LLR of the n-th bit node from the m-th check node toward the n-th bit node.

(1) Initialization

As for the respective m and n, an initialization process using the following equation is performed.

$$z_{mn} = F_n = \log\frac{P(c_n = 1 \mid y)}{P(c_n = 0 \mid y)}$$

(2) Iterative Decoding in Row Direction

As for the respective m and n, the followings are defined.

$$T_{mn} = \prod_{n' \in N(m) \setminus n} \frac{1 - \exp(z_{mn'})}{1 + \exp(z_{mn'})}$$

$$L_{mn} = \ln\left(\frac{1 - T_{mn}}{1 + T_{mn}}\right)$$

(3) Iterative Decoding in Column Direction

As for the respective m and n, the followings are defined.

$$z_{mn} = F_n + \sum_{m' \in M(n) \setminus m} L_{m'n}$$

$$z_n = F_n + \sum_{m \in M(n)} L_{mn}$$

(4) Temporary Decoding $\hat{c}=[\hat{c}_n]$ is determined as follows.

$\hat{c}_n=1$ if $z_n \geq 0$ $\hat{c}_n=0$ if $z_n<0$

If $\hat{c}H^T=0$, the decoding process is stopped and $\hat{c}$ is determined as a correct decoding result. If $\hat{c}H^T \neq 0$ and the decoding process is not reached the maximum iteration number, the processes from (2) are iteratively performed. If $\hat{c}H^T \neq 0$ and the decoding process is reached the maximum iteration number, the decoding processes is stopped and the failure of decoding is notified.

In the holographic optical information processing apparatus, two-dimensional inter-symbol interference can often occur due to the misalignment between the light receiving array device and the image of a data page. Accordingly, a method of decoding an LDPC code with improved BER has been required.

SUMMARY

According to an aspect of the invention, there is provided a method of decoding a received signal encoded with an LDPC code. The method includes initializing bits with an initial value of the received signal, obtaining posterior values of the bits by iteratively decoding the bits in a row direction and a column direction, determining on the basis of the posterior values whether an iterative decoding operation should be performed and comparing the posterior values with predetermined values and updating the initial value of the bits, when it is determined that the iterative decoding operation is performed.

According to another aspect of the invention, there is provided a device for decoding a received signal encoded with an LDPC code. The device includes an initialization unit initializing bits with an initial value of the received signal, an iterative decoding unit obtaining posterior values of the bits by iteratively decoding the bits in a row direction and a column direction, an iteration determining unit determining on the basis of the posterior values whether an iterative decoding operation should be performed and a partial compensation unit comparing the posterior values with a predetermined value and updating the initial value of the bits, when it is determined that the iterative decoding operation is performed.

According to still another aspect of the invention, there is provided an optical information reproducing apparatus for reproducing optical information from a reproducing beam generated by irradiating a reference beam to a recording medium. The apparatus includes an optical information detector detecting the reproducing beam and detecting an image of a data page from the reproducing beam, an equalizer equalizing the image of a data page and a data decoder receiving an output of the equalizer as a received signal and decoding an LDPC code. The data decoder includes an initialization unit initializing bits with an initial value of the received signal, an iterative decoding unit obtaining posterior values of the bits by iteratively decoding the bits in a row direction and a column direction, an iteration determining unit determining on the basis of the posterior values whether an iterative decoding operation should be performed and a partial compensation unit comparing the posterior values with a predetermined value and updating the initial value of the bits, when it is determined that the iterative decoding operation is performed.

BRIEF DESCRIPTION OF THE DRAWINGS

The above and other aspects and advantages of the present invention will become more apparent by describing in detail exemplary embodiments, taken in conjunction with the accompanying drawings in which.

DESCRIPTION OF EXEMPLARY EMBODIMENTS

Figure 1:
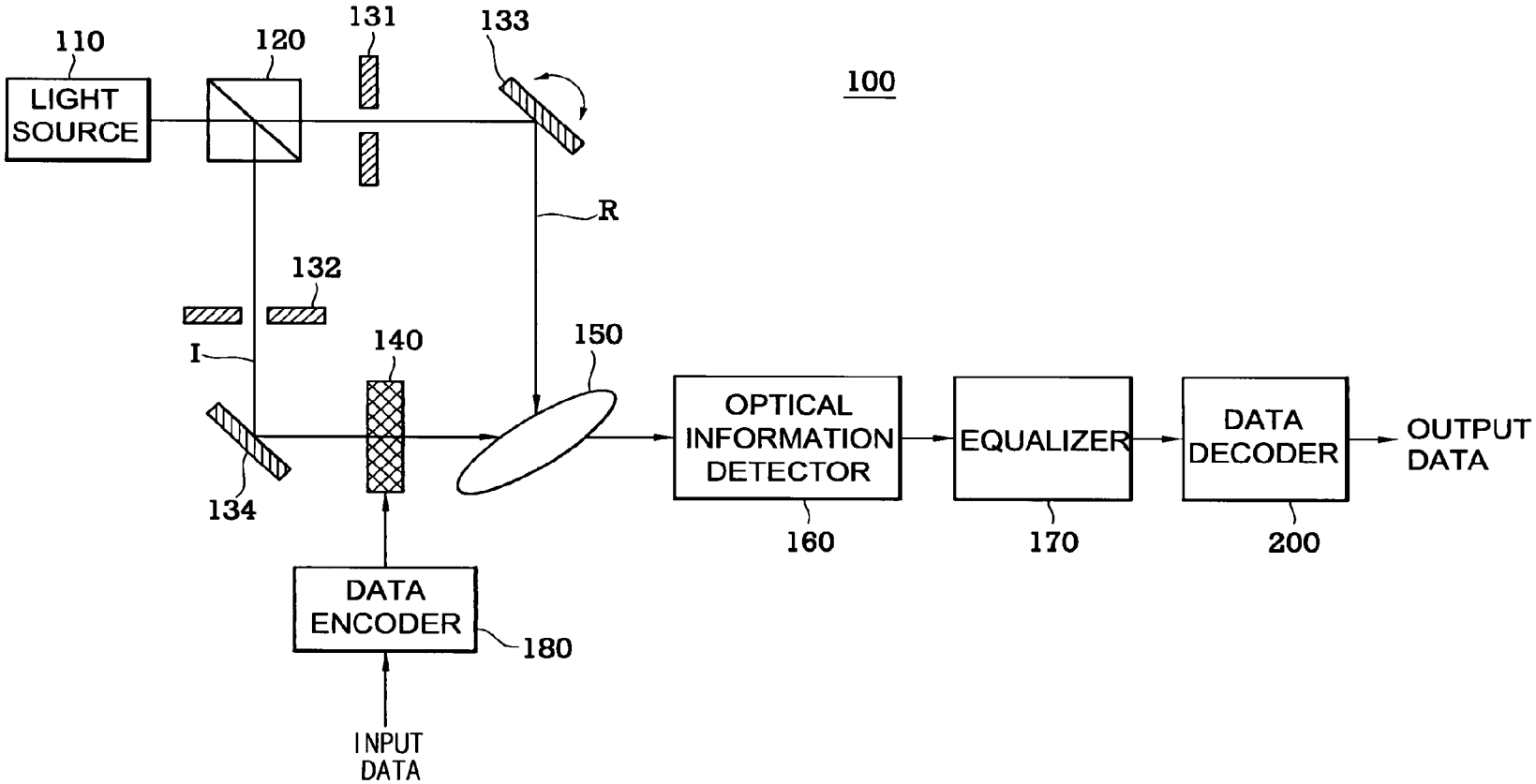
FIG. 1 is a block diagram illustrating an optical information processing apparatus.

Hereinafter, exemplary embodiments of the present invention will be described with reference to the attached drawings. In the following description, like elements are denoted by like reference numerals.

FIG. 1 is a block diagram illustrating a configuration of an optical information processing apparatus. The optical information processing apparatus can record optical information in a recording medium by loading data into an information beam and irradiating the information beam along with a reference beam to the recording medium. The optical information processing apparatus can reproduce optical information from a reproducing beam generated from the recording medium by irradiating only the reference beam to the recording medium. In one exemplary embodiment, the optical information processing apparatus can be an optical information recording and reproducing apparatus. In another exemplary embodiment, by locking a spatial light modulator and only providing the function of reproducing optical information by the use of the reference beam, the optical information processing apparatus can be an optical information reproducing apparatus. In still another exemplary embodiment, by locking an optical information detector and only providing the function of recording optical information, the optical information processing apparatus can be an optical information recording apparatus.

Referring to FIG. 1, the optical information processing apparatus 100 can include a light source 110, a beam splitter 120, a multiplexer 133, a spatial light modulator 140, an optical information detector 160, an equalizer 170, a data encoder 180, and a data decoder 200.

A beam emitted from the light source 110 can be split into a reference beam R and an information beam I by the beam splitter 120. The reference beam R passes through a first shutter 131, is reflected by the multiplexer 133, and then is incident on the recording medium at a predetermined angle.

The information beam I passes through a second shutter 134, is reflected by a reflecting mirror 134, and then is incident on the spatial light modulator 140. At this time, binary data by encoded pages, that is, data-page information, supplied from the data encoder 180 is input to the spatial light modulator 140. The data encoder 180 can encode the input data by an LDPC code and then supply the encoded data to the spatial light modulator 140 by pages.

The spatial light modulator 140 can optically modulate the data page information input from the data encoder 180 to generate a data page having a two-dimensional image, load the data page into the incident information beam I, and then irradiate the information beam I to the recording medium 150.

When the reference beam R and the information beam I are irradiated to the recording medium 150, an interference pattern between the reference beam R and the information beam I is recorded.

The multiplexer 133 can perform an angular multiplexing operation by adjusting an angle at which the reference beam R is incident on the recording medium 150. The multiplexer 133 may be a rotating mirror such as a galvano mirror.

At the time of reproducing recorded data, only the reference beam R can be irradiated to the recording medium 150. The first shutter 131 transmits the reference beam R split by the beam splitter 120 and the second shutter 132 blocks the information beam I. At this time, the reference beam R is diffracted by the interference pattern recorded in the recording medium 150 to generate a reproducing beam carrying an image of a data page. The reproducing beam is detected in the image of the data page by the optical information detector 160. The detected image of the data page is equalized by the equalizer 170 and is decoded by the data decoder 200.

The optical information detector 160 may include a light receiving array device such as a CMOS device and a CCD. The equalizer 170 may employ a well-known structure such as a minimum mean square error (MMSE) equalizer. The data decoder 200 is a device for decoding an LDPC code. The data decoder 200 decodes the LDPC code and outputs final output data.

Image pixels of the data page (hereinafter, referred to as "data pixels") and pixels of the light receiving array device (hereinafter, referred to as "detection pixels") may not be matched with each other due to misalignment. Generally, when the misalignment occurs in a pixel, the pixel is affected by 8 neighboring pixels.

Figure 2:
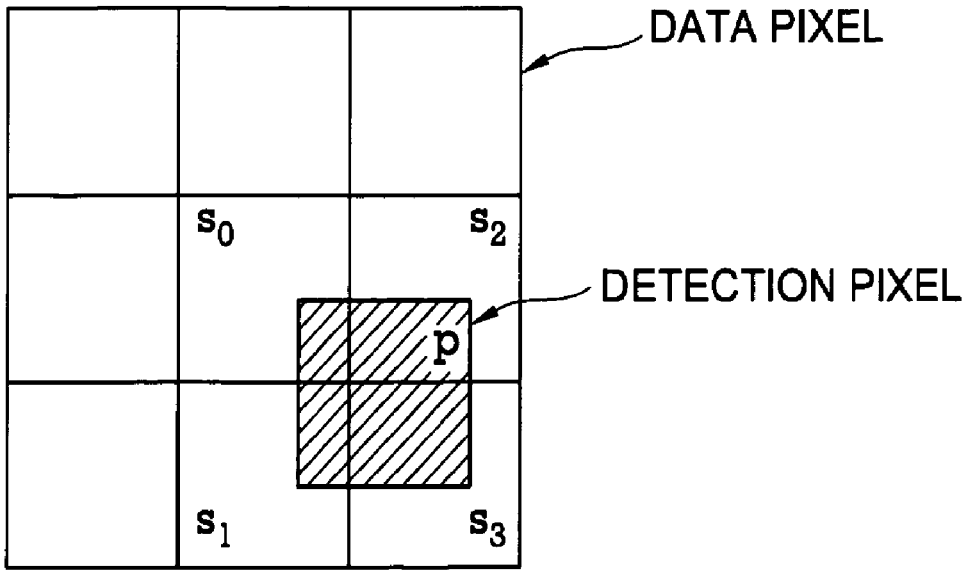
FIG. 2 is a diagram illustrating an occurrence of misalignment.

FIG. 2 is a diagram illustrating an occurrence of misalignment.

Referring to FIG. 2, a detection pixel p is not matched with a corresponding original data pixel $s_0$ when the misalignment occurs. When no misalignment occurs, the detection pixel p can accurately be matched with the corresponding original data pixel $s_0$.

When the misalignment occurs as shown in FIG. 2, bit data detected by the use of the detection pixel p are affected by three neighboring data pixels $s_1$, $s_2$, and $s_3$ as well as by the corresponding original data pixel $s_0$.

The position, direction, and number of the neighboring data pixels can be changed variously, but not limited to the illustrated shape. For example, when the misalignment occurs in the vertical direction, the detection pixel p can be affected by only one neighboring pixel $s_1$.

The bit value of the detection pixel p can change in the misalignment direction in accordance with the bit values of the neighboring data pixels $s_1$, $s_2$, and $s_3$. For example, when the value of the data pixel $s_0$ is "0", the values of the neighboring data pixels $s_1$, $s_2$, and $s_3$ are added to the value of the detection pixel p and thus the initial LLR value of the detection pixel p may be increased. When the values of the neighboring data pixels $s_1$, $s_2$, and $s_3$ are all "1", an incorrect result may be caused that the value of the detection pixel p is "1."

When the value of the data pixel $s_0$ is "1", the values of the neighboring data pixels $s_1$, $s_2$, and $s_3$ are added to the value of the detection pixel p and thus the initial LLR value of the detection pixel p may be decreased. When the values of the neighboring data pixels $s_1$, $s_2$, and $s_3$ are all "0", an incorrect result may be caused that the value of the detection pixel p is "0."

The opposite situation may occur as a result of misalignment. For example, when the value of the data pixel $s_0$ is "0" and the values of the neighboring data pixels $s_1$, $s_2$, and $s_3$ are all "0", the value of the detection pixel p is "0" and thus the misalignment has a good influence on the decoding operation. When the value of the data pixel $s_0$ is "1" and the values of the neighboring data pixels $s_1$, $s_2$, and $s_3$ are all "1", the value of the detection pixel p is "1" and thus the misalignment has a good influence on the decoding operation similarly.

According to the invention, when the misalignment has a bad influence on the decoding operation in the process of an iterative decoding operation, the decoding operation is partially compensated for by the use of an iterative decoding operation using probability. As a result, it can enhance the convergence speed and lower the BER.

Figure 3:
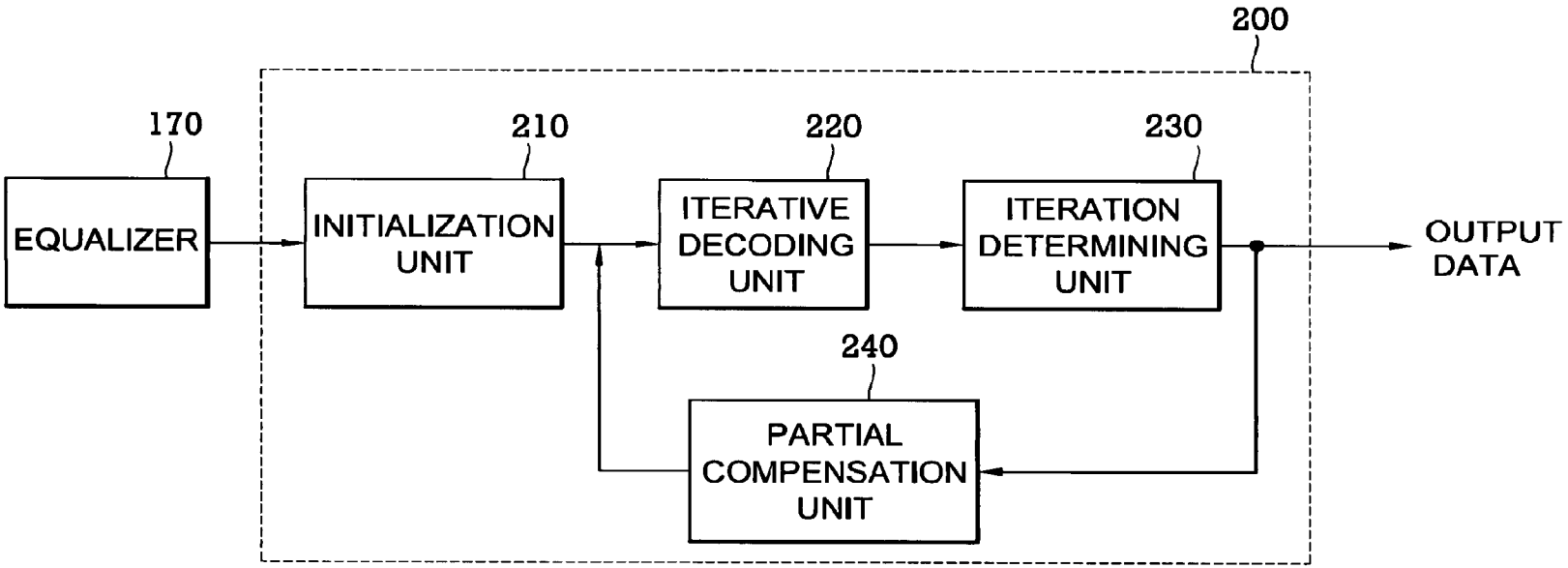
FIG. 3 is a block diagram illustrating a data decoder of FIG. 1.

FIG. 3 is a block diagram illustrating a data decoder of FIG. 1.

Referring to FIG. 3, the data decoder 200 can include an initialization unit 210, an iterative decoding unit 220, an iteration determining unit 230, and a partial compensation unit 240.

The initialization unit 210 can perform an initialization operation for a received signal. The initialization unit 210 can initialize the bits $z_{mn}$ by the use of the LLR of the received signal.

The iterative decoding unit 220 can perform an iterative decoding operation in the row direction and the column direction to calculate posterior LLR ($z_n$) of the bits. The iterative decoding unit 220 can first perform the row-direction iterative decoding operation and then perform the column-direction iterative decoding operation using the result of the row-direction iterative decoding operation. The iterative decoding unit 220 can be divided into a row-direction iterative decoding unit and a column-direction iterative decoding unit.

The iteration determining unit 230 can calculate a temporary code word $\hat{c}$ from the code of the posterior LLR $z_n$ and determine whether the iterative decoding operation should be performed again. The method of determining the repetition will be described later with reference to FIG. 4. When the iterative decoding operation is successfully finished, the iteration determining unit 230 outputs the code word $\hat{c}$ as output data.

When the iterative decoding operation is performed, the partial compensation unit 240 can update the initial values of the bits. The partial compensation unit 240 updates the initial values by comparing a predetermined reference LLR $L_d$ of a bit to be corrected with the posterior LLR $z_n$. Here, the degree of update of the initial values is varied depending upon the direction and magnitude of the misalignment.

Hereinafter, a decoding method using the data decoder 200 will be described with reference to FIG. 4.

Assuming that a code word is denoted by c, a transmitted signal is denoted by x, a received signal is denoted by y, and a noise of a channel is denoted by n, $y=[y_n]=x+n$ is obtained. The code word $c=(c_1, c_2, \ldots, c_N)$ can be mapped onto the transmitted signal $x=(x_1, x_2, \ldots, x_N)$.

The decoding operation is to obtain a signal in which the probability of the code word with respect to a received signal is largest. The decoding operation is to obtain a code word $\hat{c}$ in which the value of $P(\hat{c}|y)$ is largest.

The size of a parity check matrix H is M×N and the parity check matrix H can be expressed by $H=[h(m,n)]$. A set of bit nodes participating in the m-th check node is expressed by $N(m)=\{n|h(m,n)=1\}$. Similarly, a set of check nodes participating in the n-th bit node is expressed by $M(n)=\{m|h(m,n)=1\}$. The magnitudes of the sets N(m) and M(n) are expressed by |N(m)| and |M(n)|. N(m)\n denotes N(m) from which the n-th bit node is excluded, and M(n)\m denotes M(n) from which the m-th check node is excluded.

Notations used for the iterative decoding algorithm are as follows.

$F_n$ denotes an LLR of the n-th bit node obtained from the received signal $y_n$.

$Z_{mn}$ denotes an LLR of the n-th bit node from the n-th bit node toward the m-th check node.

$z_n$ denotes a posterior LLR of the n-th bit node obtained from each iterative calculation.

$L_{mn}$ denotes an LLR of the n-th bit node from the m-th check node toward the n-th bit node.

p denotes a bit node to be corrected.

s denotes a neighboring bit vector affecting the bit p in the misalignment direction. For example, when three neighboring bit nodes affect the bit node p, $s=(s_1, S_2, s_3)$.

V denotes a vector indicating the direction and magnitude of misalignment.

D(s, V) denotes a variation level of the bit node p depending upon s and V.

$L_d$ denotes a reference LLR of the bit node p for determining the update of $F_p$.

$d_0$ and $e_0$ denote constants for determining an LLR decreasing at the time of update.

$d_1$ and $e_1$ denote constants for determining an LLR increasing at the time of update.

Figure 4:
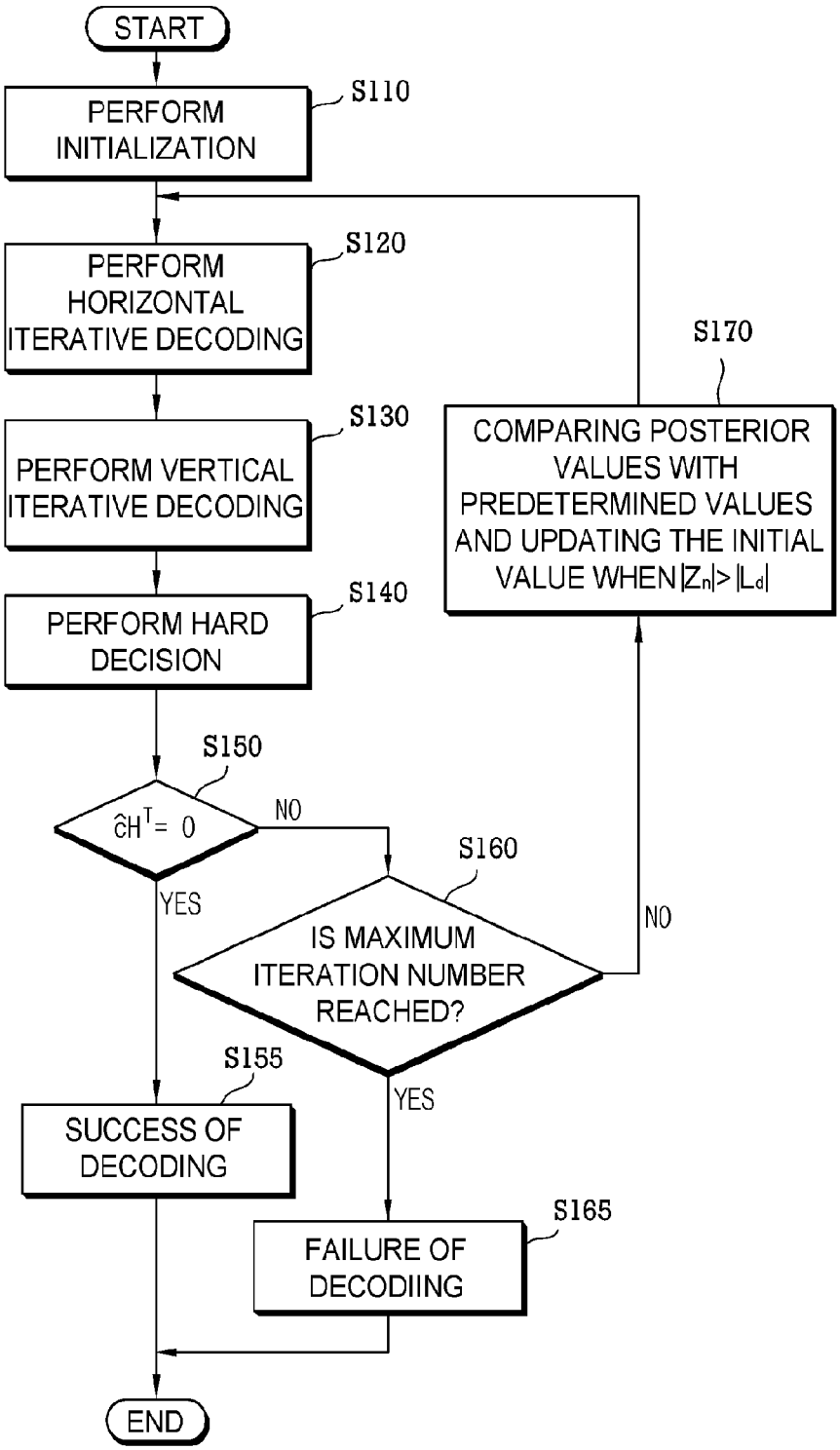
FIG. 4 is a flowchart illustrating a method of decoding an LDPC code.

FIG. 4 is a flowchart illustrating a method of decoding an LDPC code.

Referring to FIG. 4, an initialization operation using Equation 1 is performed for the respective m and n (S110).

$$z_{mn} = F_n = \log\frac{P(c_n = 1 \mid y)}{P(c_n = 0 \mid y)} \qquad \text{Equation 1}$$

When the initialization operation is finished, an iterative decoding operation is performed.

In a row-direction iterative decoding operation, Equation 2 is defined for the respective m and n (S120).

$$T_{mn} = \prod_{n' \in N(m)\backslash n} \frac{1-\exp(z_{mn'})}{1+\exp(z_{mn'})} \qquad \text{Equation 2}$$

-continued $$L_{mn} = \ln\left(\frac{1-T_{mn}}{1+T_{mn}}\right)$$

In a column-direction iterative decoding operation subsequent to the row-direction iterative decoding operation, an updating operation expressed by Equation 3 is performed for the respective m and n (S130).

$$z_{mn} = F_n + \sum_{m' \in M(n)\backslash m} L_{m'n} \qquad \text{Equation 3}$$

$$z_n = F_n + \sum_{m \in M(n)} L_{mn}$$

In a hard decision operation, $\hat{c}=[\hat{c}_n]$ is determined by Equation 4 (S140).

$$\hat{c}_n=1 \text{ if } z_n \geq 0 \qquad \text{Equation 4}$$

$$\hat{c}_n=0 \text{ if } z_n<0$$

Next, it is determined depending upon the value of $\hat{c}H^T$ whether the iterative decoding operation should be performed (S150).

If $\hat{c}H^T=0$, the decoding operation is stopped and $\hat{c}$ is determined as a correct decoding result (S155).

If $\hat{c}H^T \neq 0$, it is determined whether the decoding operation has been performed as many as the maximum repetition number (S160). When the decoding operation has been performed as many as the maximum repetition number, the decoding operation is stopped and the failure of decoding is notified (S165).

When the decoding operation has not been performed as many as the maximum repetition number, a probabilistic partial compensation operation is performed (S170).

If $z_n<-L_d$, $d_0$ is calculated by Equation 5.

$$d_0=P(s_1=1)D(s_1,V)+P(s_2=1)D(s_2,V)+P(s_3=1)D(s_3,V) \qquad \text{Equation 5}$$

Here, the update operation is performed with $F_n=F_n-d_0e_0$.

If $z_n<+L_d$, $d_1$ is calculated by Equation 6.

$$d_1=P(s_1=0)D(s_1,V)+P(s_2=0)D(s_2,V)+P(s_3=0)D(s_3,V) \qquad \text{Equation 6}$$

Here, the update operation is performed with $F_n=F_n-d_1e_1$.

The initial value is updated when $|z_n|>|L_d|$. The degree of update of the initial value is varied depending upon the direction and magnitude of misalignment.

After the initial values are updated as described above, the row-direction iterative decoding operation (S120) is performed again.

$L_d$, $e_0$, and $e_1$ cannot be varied in the course of performing the decoding operation and can be properly selected depending upon a channel state. $e_0$ can be greater than $e_1$. D(s, V) used for calculating $d_0$ and $d_1$ is associated with the intensity of an added portion due to the misalignment. Since it is difficult to accurately calculate, D(s, V) and D(s, V) can be calculated to be proportional to the added area and the distance from the center of a pixel. The value calculated at the time of performing the hard decision operation can be used as a probability value P(s).

According to the exemplary embodiment, the initial LLRs of the bits can be changed which have probability larger than a predetermined level in the course of performing the decoding operation among the bits having been varied from the original value due to the misalignment. It is possible to enhance the convergence speed of the LLR-BP algorithm and to lower the BER. The initial LLR of the bits which are estimated to have a normal LLR in spite of influence of the misalignment are corrected on the basis of the degree of influence of the misalignment. By enhancing the ratio of the bits having a correct LLR, it is possible to enhance the error correcting ability of correcting the bits having an incorrect LLR.

Figure 5:
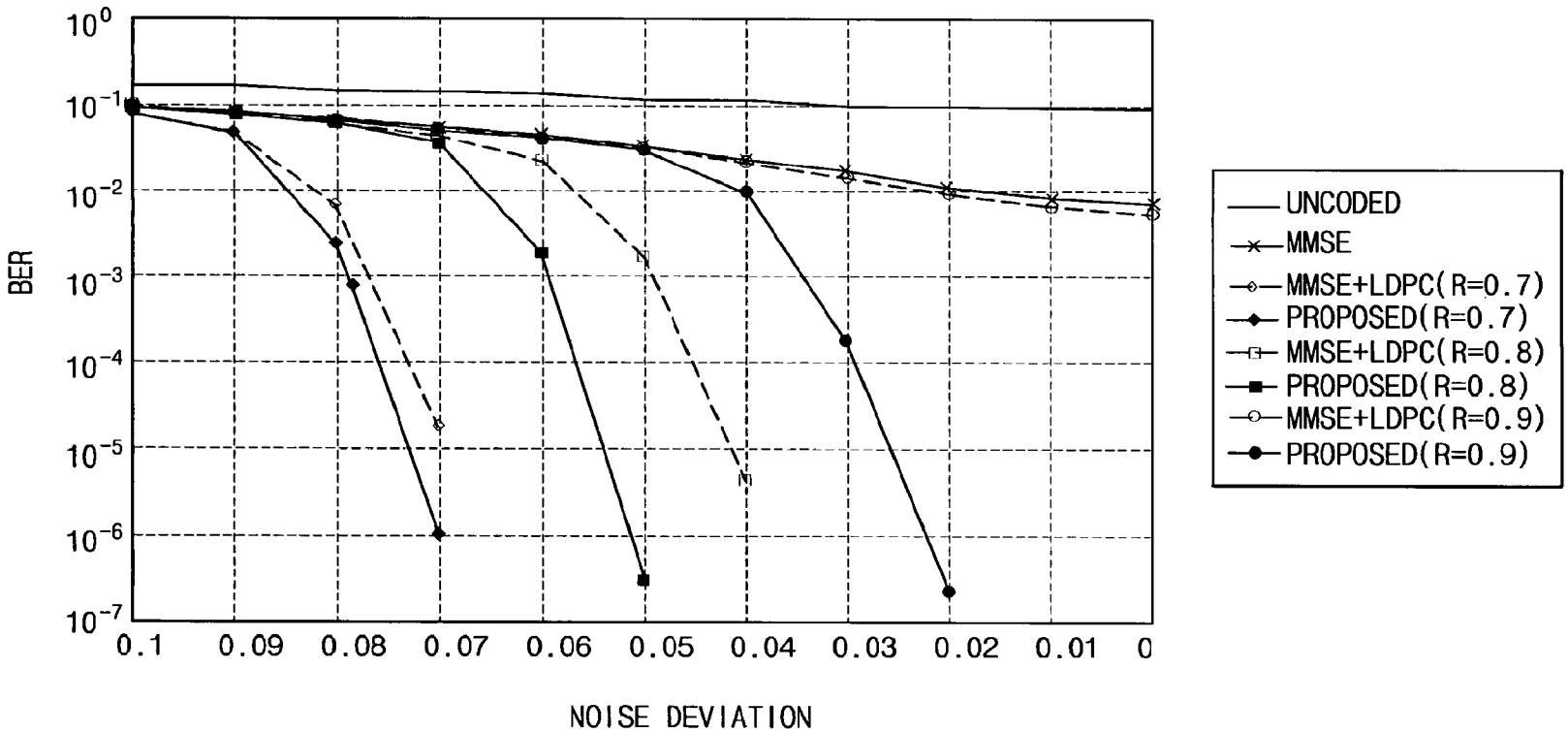
FIG. 5 is a graph illustrating performance of decoding methods by using relations between noise deviation and BER.

FIG. 5 is a graph illustrating performance of the decoding methods by using relations between noise deviation and BER.

Referring to FIG. 5, "UNCODED" indicates a case in which the equalizer and the LDPC code are not used, and "MMSE" indicates a case in which only the MMSE equalizer is used. A known pattern which is sufficiently large is used as the MMSE equalizer, which is subjected to a 3×3 convolution. "MMSE+LDPC" indicates a case in which a decoding method using a known LLR-BP algorithm is used in the MMSE equalizer. "PROPOSED" indicates a case in which a decoding method using the modified LLR-BP algorithm is used in the MMSE equalizer.

It was assumed that the Nyquist size is "1" and the misalignment is "⅛" in the horizontal direction and ⅜ in the vertical direction. The length of the LDPC code is 2500 and the code rates of 0.7, 0.8, and 0.9 were respectively simulated. In the modified LLR-BP algorithm, Ld=0.2, e0=0.633, and e1=0.1267 is set. D(s, V) was calculated as a ratio of the added area for the purpose of simple calculation. The $\hat{c}(s)$ determined at the time of performing the hard decision operation was used as P(s).

As a result of performing the decoding operation using the LDPC code having a strong error correcting function, it can be seen that the BER is drastically enhanced in comparison with "UNCODED" or the case in which only the equalizer is used. As the code rate increases, the BER in the proposed decoding method decreases. When the code rate is 0.9, most errors not corrected by the known LLR-BP algorithm are corrected by the modified LLR-BP algorithm.

It is possible to enhance the processing speed of decoding the LDPC code by using the modified LLR-BP algorithm and to improve the BER. It is possible to enhance the reliability of the holographic optical information processing apparatus having severe misalignment.

What is claimed is:

1. A method of decoding a received signal encoded with an LDPC code, the method comprising:

initializing bits with an initial value of the received signal;

obtaining posterior values of the bits by iteratively decoding the bits in a row direction and a column direction;

determining on the basis of the posterior values whether an iterative decoding operation should be performed; and comparing the posterior values with predetermined values and updating the initial value of the bits, when it is determined that the iterative decoding operation is performed.

2. The method according to claim 1, wherein the updating of the initial values comprises updating the initial value of the bits when the absolute values of the posterior values are greater than the absolute value of the predetermined value.

3. A device for decoding a received signal encoded with an LDPC code, the device comprising:

an initialization unit initializing bits with an initial value of the received signal;

an iterative decoding unit obtaining posterior values of the bits by iteratively decoding the bits in a row direction and a column direction;

an iteration determining unit determining on the basis of the posterior values whether an iterative decoding operation should be performed; and a partial compensation unit comparing the posterior values with a predetermined value and updating the initial value of the bits, when it is determined that the iterative decoding operation is performed.

4. The device according to claim 3, wherein the partial compensation unit updates the initial value of the bits when the absolute values of the posterior values are greater than the absolute value of the predetermined value.

5. An optical information reproducing apparatus for reproducing optical information from a reproducing beam generated by irradiating a reference beam to a recording medium, the apparatus comprising:

an optical information detector detecting the reproducing beam and detecting an image of a data page from the reproducing beam;

an equalizer equalizing the image of a data page; and a data decoder receiving an output of the equalizer as a received signal and decoding an LDPC code, wherein the data decoder comprises:

an initialization unit initializing bits with an initial value of the received signal;

an iterative decoding unit obtaining posterior values of the bits by iteratively decoding the bits in a row direction and a column direction;

an iteration determining unit determining on the basis of the posterior values whether an iterative decoding operation should be performed; and a partial compensation unit comparing the posterior values with a predetermined value and updating the initial value of the bits, when it is determined that the iterative decoding operation is performed.

6. The optical information reproducing apparatus according to claim 5, wherein the partial compensation unit varies the degree of increase of the initial value on the basis of values of neighboring data pixels resulting from misalignment between the optical information detector and the recording medium.

7. The optical information reproducing apparatus according to claim 5, wherein the equalizer is MMSE equalizer.

8. The optical information reproducing apparatus according to claim 5, wherein the partial compensation unit updates the initial value of the bits when the absolute values of the posterior values are greater than the absolute value of the predetermined value.

*9. A method of decoding, the method comprising:*

*receiving a signal corresponding to an stored image of a data page of bits encoding a LDPC code in a storage device, said bits being initialized with an initial value of the received signal;*

*iteratively decoding the bits encoding the LDPC code in a row direction and a column direction of the stored image based on the initial value to obtain decoded bit values associated with one or more likelihood ratios;*

*determining a variation level of a bit dependent on a misalignment of pixels within the stored image;*

*updating the initial value based on the decoded bit values and the determined variation level; and*

*determining updated values of the bits based on the updated initial value.*

*10. The method of claim 9, wherein the a likelihood ratio comprises a log-likelihood ratio (LLR).*

*11. The method of claim 9, wherein the decoded bit values comprise posterior values of the bits.*

*12. The method of claim 9, wherein the updating of the initial values comprises updating the initial value of the bits when the absolute values of the decoded bit values are greater than the absolute value of the predetermined value.*

*13. A device for decoding a received signal encoded with an LDPC code, the device comprising:*

*an initialization unit initializing bits encoding the LDPC code with an initial value of the received signal;*

*an iterative decoding unit obtaining decoded bit values based on a likelihood ratio of the bits by iteratively decoding the bits in a row direction and a column direction;*

*an iteration determining unit determining on the basis of the decoded bit values whether an iterative decoding operation should be performed; and*

*a partial compensation unit comparing the decoded bit values with a predetermined value and updating the initial value of the bits, when it is determined that the iterative decoding operation is performed.*

*14. The device of claim 13, wherein the a likelihood ratio comprises a log-likelihood ratio (LLR).*

*15. The device of claim 13, wherein the decoded bit values comprise posterior values of the bits.*

*16. The device of claim 13, wherein the updating of the initial values comprises updating the initial value of the bits when the absolute values of the decoded bit values are greater than the absolute value of the predetermined value.*

*17. An optical information reproducing apparatus for reproducing optical information from a reproducing beam generated by irradiating a reference beam to a recording medium, the apparatus comprising:*

*an optical information detector detecting the reproducing beam and detecting an image of a data page from the reproducing beam;*

*an equalizer equalizing the image of a data page; and*

*a data decoder receiving an output of the equalizer as a received signal and decoding an LDPC code,*

*wherein the data decoder comprises:*

*an initialization unit initializing bits encoding the LDPC code with an initial value of the received signal;*

*an iterative decoding unit obtaining decoded bit values of the bits by iteratively decoding the bits in a row direction and a column direction, said associated with a likelihood ratio;*

*an iteration determining unit determining on the basis of the posterior values whether an iterative decoding operation should be performed; and*

*a partial compensation unit comparing the decoded bit values with a predetermined value and updating the initial value of the bits, when it is determined that the iterative decoding operation is performed.*

*18. The apparatus of claim 17, wherein the a likelihood ratio comprises a log-likelihood ratio (LLR).*

*19. The device of claim 17, wherein the decoded bit values comprise posterior values of the bits.*

*20. The apparatus of claim 17, wherein the updating of the initial values comprises updating the initial value of the bits when the absolute values of the decoded bit values are greater than the absolute value of the predetermined value.*

* * * * *